(12) United States Patent
Mashima et al.

(10) Patent No.: US 11,573,359 B2
(45) Date of Patent: Feb. 7, 2023

(54) METHOD FOR PRODUCING A POLARIZING PLATE

(71) Applicant: ZEON CORPORATION, Tokyo (JP)

(72) Inventors: Hiromu Mashima, Tokyo (JP); Takamichi Inomata, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 46 days.

(21) Appl. No.: 17/329,147

(22) Filed: May 25, 2021

(65) Prior Publication Data

US 2021/0278580 A1 Sep. 9, 2021

Related U.S. Application Data

(63) Continuation of application No. 16/633,269, filed as application No. PCT/JP2018/027510 on Jul. 23, 2018, now abandoned.

(30) Foreign Application Priority Data

Jul. 25, 2017 (JP) .................. 2017-143264

(51) Int. Cl.
*G02B 5/30* (2006.01)
*G02F 1/1335* (2006.01)
(Continued)

(52) U.S. Cl.
CPC ........ *G02B 5/305* (2013.01); *B29D 11/00644* (2013.01); *G02F 1/133528* (2013.01); *H01L 51/5281* (2013.01)

(58) Field of Classification Search
None
See application file for complete search history.

(56) References Cited

U.S. PATENT DOCUMENTS 5,143,979 A ‡ 9/1992 Nishi ............... C08G 61/08
525/332.1
5,366,812 A ‡ 11/1994 Takahashi ........ B01D 39/2068
264/1.6
(Continued)

FOREIGN PATENT DOCUMENTS

CN 103201656 A 7/2013
CN 105683788 A 6/2016
(Continued)

OTHER PUBLICATIONS

Jan. 28, 2020, International Preliminary Report on Patentability issued in the International Patent Application No. PCT/JP2018/027510.‡

(Continued)

*Primary Examiner* — Ashok Patel
(74) *Attorney, Agent, or Firm* — Kenja IP Law PC

(57) ABSTRACT

A method for producing a polarizing plate including a polarizer and a substrate film is provided. The method comprises: stretching a primary film to obtain a polarizer material film; providing an unstretched substrate film on the polarizer material film to obtain a layered body; and stretching the layered body to obtain the polarizing plate. The polarizer includes a dichroic material and has a thickness T of 20 μm or less. A phase difference Re in an in-plane direction of the substrate film in the polarizing plate is 20 nm or less.

10 Claims, 5 Drawing Sheets

(51) Int. Cl.
  *H01L 51/52* (2006.01)
  *B29D 11/00* (2006.01)

(56) References Cited

U.S. PATENT DOCUMENTS

| | | | | |
|---|---|---|---|---|
| 6,342,549 | B1 ‡ | 1/2002 | Hirose | C08K 5/0016 524/120 |
| 6,492,468 | B1 ‡ | 12/2002 | Chen | G11B 7/26 525/338 |
| 6,881,453 | B2 ‡ | 4/2005 | Kido | G02B 5/3083 428/1.1 |
| 10,088,605 | B2 ‡ | 10/2018 | Ishiguro | G02B 5/3083 |
| 2012/0056340 | A1 * | 3/2012 | Kitagawa | B32B 41/00 264/1.34 |
| 2012/0057232 | A1 ‡ | 3/2012 | Goto | G02B 5/30 359/487.02 |
| 2015/0212368 | A1 ‡ | 7/2015 | Yonemoto | G02B 5/3025 349/61 |
| 2016/0084990 | A1 ‡ | 3/2016 | Nam | G02B 5/3033 428/336 |
| 2016/0252660 | A1 | 9/2016 | Matsuno et al. | |
| 2020/0158932 | A1 ‡ | 5/2020 | Mashima | B32B 27/30 |
| 2020/0209450 | A1 ‡ | 7/2020 | Mashima | B29C 48/08 |

FOREIGN PATENT DOCUMENTS

| | | | | |
|---|---|---|---|---|
| EP | 0578822 | B1 | 7/1997 | |
| EP | 0578822 | B1 ‡ | 7/1997 | C08J 5/18 |
| EP | 2426530 | A2 | 3/2012 | |
| JP | H02180976 | A | 7/1990 | |
| JP | H02180976 | A ‡ | 7/1990 | |
| JP | H03109418 | A | 5/1991 | |
| JP | H03109418 | A | 5/1991 | |
| JP | H03223328 | A ‡ | 10/1991 | |
| JP | H03223328 | A | 10/1991 | |
| JP | H04301415 | A | 10/1992 | |
| JP | H04301415 | A ‡ | 10/1992 | |
| JP | H05212828 | A | 8/1993 | |
| JP | H05212828 | A ‡ | 8/1993 | |
| JP | H07145213 | A | 6/1995 | |
| JP | H07145213 | A ‡ | 6/1995 | |
| JP | 2002105151 | A | 4/2002 | |
| JP | 2002105151 | A ‡ | 4/2002 | |
| JP | 2006195242 | A | 7/2006 | |
| JP | 2006195242 | A ‡ | 7/2006 | |
| JP | 2011013378 | A ‡ | 1/2011 | |
| JP | 2011013378 | A | 1/2011 | |
| JP | 4691205 | B1 ‡ | 6/2011 | G02B 5/3083 |
| JP | 4691205 | B1 | 6/2011 | |
| JP | 2016505404 | A | 2/2016 | |
| JP | 2016505404 | A ‡ | 2/2016 | |
| JP | 2016170438 | A | 9/2016 | |
| JP | 2017097048 | A | 6/2017 | |
| JP | 2017097048 | A ‡ | 6/2017 | |
| WO | 0032646 | A1 | 6/2000 | |
| WO | WO-0032646 | A1 ‡ | 6/2000 | G11B 7/2533 |
| WO | 0181957 | A1 | 11/2001 | |
| WO | WO-0181957 | A1 ‡ | 11/2001 | C08J 5/18 |
| WO | 2015002020 | A1 | 1/2015 | |
| WO | WO-2015002020 | A1 ‡ | 1/2015 | G02B 5/3083 |
| WO | 2016013342 | A1 | 1/2016 | |

OTHER PUBLICATIONS

Oct. 23, 2018, International Search Report issued in the International Patent Application No. PCT/JP2018/027510.‡

Apr. 6, 2021, Extended European Search Report issued by the European Patent Office in the corresponding European Patent Application No. 18838980.3.

\* cited by examiner

‡ imported from a related application

METHOD FOR PRODUCING A POLARIZING PLATE

CROSS-REFERENCE TO RELATED APPLICATION

The present application is a continuation application of U.S. patent application Ser. No. 16/633,269 filed Jan. 23, 2020, which is a National Stage Application of PCT/JP2018/027510 filed Jul. 23, 2018, which claims priority of Japanese Patent Application No. 2017-143264 filed Jul. 25, 2017. The disclosures of the prior applications are hereby incorporated by reference herein in their entirety.

FIELD

The present invention relates to a polarizing plate and a display device.

BACKGROUND

As a display device such as a liquid crystal display device and an organic electroluminescent (EL) display device, a display device having a large surface area, light weight and thin thickness has been required in prior art. Therefore, as a panel constituting the display device, a thin panel has been required in prior art.

In a display device, a polarizing plate including a polarizer and a protective film for protecting the polarizer is generally used. In order to constitute a thin display device, a thinner polarizing plate is also required. In particular, materials generally used for a polarizer, such as polyvinyl alcohol, may shrink in a use environment of a display device. Such shrinkage may cause a problem of warping when the display device has a large surface area and thin thickness. Therefore, employment of a polarizer having a thickness as thin as 10 μm or less is expected to contribute to thickness reduction of the display device attributed to the thin thickness of the polarizer itself, and also contribute to reduction of the aforementioned occurrence of the warping.

However, when such a thin polarizer is produced from polyvinyl alcohol by a prior art production method, melt-breakage of the polarizer frequently occurs. As methods for producing a polarizing plate including a thin polarizer with which such melt-breakage of the polarizer can be avoided, some methods have been proposed. For example, Patent Literature 1 proposes a method in which a layered body is obtained by attaching an unstretched polyvinyl alcohol-based film to an unstretched high-density polyethylene substrate film, the layered body is then subjected to a stretching treatment, and the substrate film is separated therefrom to obtain a polyvinyl alcohol-based film.

Patent Literature 2 proposes a method in which an aqueous solution containing a polyvinyl alcohol-based resin is applied onto an amorphous ester-based thermoplastic resin substrate to form a polyvinyl alcohol-based resin layer and obtain a layered body, the layered body is then subjected to a stretching treatment, a dichroic material is oriented to obtain a colored layered body, and the colored layered body is subjected to a stretching treatment to obtain an optical film.

CITATION LIST

Patent Literature

Patent Literature 1: Japanese Translation of PCT Patent Application Publication No. 2016-505404 (corresponding publication: U.S. Patent Application Publication No. 2016/084990)

Patent Literature 2: Japanese Patent No. 4691205 B (corresponding publication: U.S. Patent Application Publication No. 2012/057232)

SUMMARY

Technical Problem

When a thin polarizing plate is produced by the methods described in Patent Literatures 1 and 2, a phase difference may be generated in the substrate film after the stretching treatment due to stretching of the layered body at a high stretching ratio. In such a case, it is difficult to use the substrate film as it is as a polarizing plate protective film, and thus the substrate film is to be separated and discarded. Therefore, an unnecessary material may be generated. Further, it may have to perform additional operations in which a protective film for protecting the polarizing plate is separately prepared and the protective film is attached to the polarizing plate.

When it is desired to obtain a thin polarizing plate having a sufficiently wide width, a considerable measure therefor may be preparation of a substrate film having an extremely large width on which a material for a polarizer (for example, a polyvinyl alcohol material) is applied or attached. However, when the width of the substrate film is too large, a problem of difficulty in production arises.

Accordingly, it is an object of the present invention to provide a polarizing plate in which a substrate film can be used also as a protective film and which can be efficiently produced even when the polarizing plate is thin, and a display device provided with the aforementioned polarizing plate.

Solution to Problem

In order to solve the aforementioned problems, the present inventor has made researches, and as a result found that when a layered body including a polarizer material film obtained through a stretching step is used, the aforementioned problems can be solved. The present invention has thus been completed.

Accordingly, the present invention provides the following <1> to <13>.

<1> A polarizing plate comprising a polarizer and a substrate film, wherein the polarizing plate is a product obtained by stretching a layered body, the layered body includes a polarizer material film and an unstretched substrate film, the polarizer material film is a film obtained by stretching a primary film, the polarizer includes a dichroic material and has a thickness T of 20 μm or less, and a phase difference Re in an in-plane direction of the substrate film in the polarizing plate is 20 nm or less.

<2> The polarizing plate according to <1>, wherein the layered body further includes an adhesive layer that is provided between the polarizer material film and the unstretched substrate film.

<3> The polarizing plate according to <1> or <2>, wherein the substrate film is a film layer formed of at least one type selected from a cycloolefin resin, an amorphous polyester resin, a polyolefin resin, and an acrylic resin.

<4> The polarizing plate according to any one of <1> to <3>, wherein the substrate film is a film formed of a cycloolefin resin, the cycloolefin resin contains a cycloolefin-based polymer, and the cycloolefin-based polymer is formed of at least one type selected from a hydrogenated product of a ring opening polymer of a norbornene-based monomer, an addition copolymer of a norbornene-based monomer and an α-olefin, and a hydrogenated product thereof.

<5> The polarizing plate according to any one of <1> to <3>, wherein the substrate film is a film formed of a cycloolefin resin, the cycloolefin resin contains a cycloolefin-based polymer, and the cycloolefin-based polymer is composed of a hydrogenated product of a block copolymer obtained by hydrogenating a block copolymer [D] composed of:

a polymer block [A] containing a repeating unit [I] derived from an aromatic vinyl compound as a main component; and a polymer block [B] containing the repeating unit [I] derived from an aromatic vinyl compound and a repeating unit [II] derived from a chain conjugated diene compound as a main component or a polymer block [C] containing the repeating unit [II] derived from a chain conjugated diene compound as a main component.

<6> The polarizing plate according to any one of <1> to <5>, wherein the substrate film contains a plasticizer and/or a softener.

<7> The polarizing plate according to <6>, wherein the plasticizer and/or softener is one or more types selected from an ester-based plasticizer and an aliphatic hydrocarbon polymer.

<8> The polarizing plate according to any one of <1> to <7>, comprising a protective film or a tackiness agent layer on one surface of the polarizer.

<9> The polarizing plate according to <8>, wherein the protective film is formed of a cycloolefin resin, an acrylic resin, a polyethylene terephthalate resin, or a triacetyl cellulose resin.

<10> A display device comprising:

two substrates;

a liquid crystal layer positioned therebetween; and the polarizing plate according to any one of <1> to <9> disposed on at least one of outer sides of the two substrates.

<11> A display device comprising:

two substrates;

a light-emitting layer positioned therebetween; and the polarizing plate according to any one of <1> to <9> disposed outside one of the two substrates.

<12> The display device according to <10>, wherein the substrate film is disposed between the polarizer and the liquid crystal layer.

<13> The display device according to <11>, wherein the substrate film is disposed between the polarizer and the light-emitting layer.

Advantageous Effects of Invention

According to the present invention, the phase difference expressed in the substrate film can be confined in a small degree even after a step of stretching a layered body. Thus, the present invention can provide a polarizing plate in which the substrate film can be used also as a protective film and which can be efficiently produced even when the polarizing plate is thin, and a display device provided with the aforementioned polarizing plate.

DESCRIPTION OF EMBODIMENTS

Hereinafter, the present invention will be described in detail with reference to embodiments and examples. However, the present invention is not limited to the following embodiments and examples, and may be freely modified for implementation without departing from the scope of claims of the present invention and the scope of their equivalents.

In the present application, a "long-length" film refers to a film with the length that is 5 times or more the width of the film, and preferably a film with the length that is 10 times or more the width, and specifically refers to a film having a length that allows a film to be wound up into a rolled shape for storage or transportation. The upper limit of the ratio of the length of the film to the width thereof is not particularly limited, but is 100,000 times or less the width thereof, for example.

In the present application, a phase difference Re of a film in the in-plane direction and a phase difference Rth thereof in the thickness direction are calculated by the formulae $Re=(nx-ny)\times d$ and $Rth=\{(nx+ny)/2-nz\}\times d$. An NZ factor of a film is a value represented by $[(nx-nz)/(nx-ny)]$ and may also be represented by $[(Rth/Re)+0.5]$. Herein, nx represents a refractive index in a slow axis direction in a plane of a film (a maximum refractive index given in the plane), ny represents a refractive index in a direction orthogonal to the slow axis direction in the plane of the film, nz represents a refractive index in the thickness direction of the film, and d represents the thickness (nm) of the film. The measurement wavelength is 590 nm, which is a representative wavelength in a visible light region, unless otherwise specified.

<Polarizing Plate>

First Embodiment: Polarizing Plate

[1. Summary of Polarizing Plate]

The polarizing plate of the present invention includes a polarizer and a substrate film. The polarizing plate is obtained by stretching a specific layered body. Such a specific layered body includes a polarizer material film and an unstretched substrate film.

The polarizer material film in the layered body is a film obtained by stretching a primary film. When the polarizer material film is further stretched by an operation of stretching the layered body, the polarizer material film may become a polarizer. That is, the primary film may be subjected to stretching to be a polarizer material film, and the polarizer material film may become a polarizer as a result of further stretching of the layered body. Herein, in addition to the stretching, the polarizer material film may also be subjected to an optional operation, such as dyeing, to be a polarizer.

The unstretched substrate film in the layered body may become a substrate film in the polarizing plate as a result of stretching of the layered body.

A polarizing plate 100 according to the first embodiment of the present invention will be described with reference to FIGS. 1 to 4.

Figure 1:
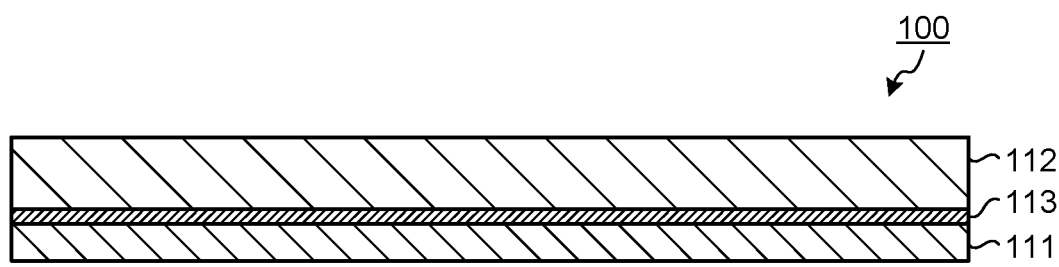
FIG. 1 is a cross-sectional view schematically illustrating a polarizing plate according to a first embodiment of the present invention.

FIG. 1 is a cross-sectional view schematically illustrating the polarizing plate 100 according to the first embodiment of the present invention. In the polarizing plate 100, a substrate film 112 is layered on one surface (the upper surface in the drawing) of a polarizer 111, as illustrated in FIG. 1. In FIG. 1, a reference numeral 113 denotes an adhesive layer. Although the polarizing plate 100 of this embodiment includes the adhesive layer 113, the polarizing plate of the present invention may also have a configuration without an adhesive layer.

The polarizing plate of this embodiment is a polarizing plate obtained by stretching a layered body including a polarizer material film, an adhesive layer, and an unstretched substrate film.

The layered body that is a material for producing the polarizing plate will be first described.

[2. Layered Body]

Figure 2:
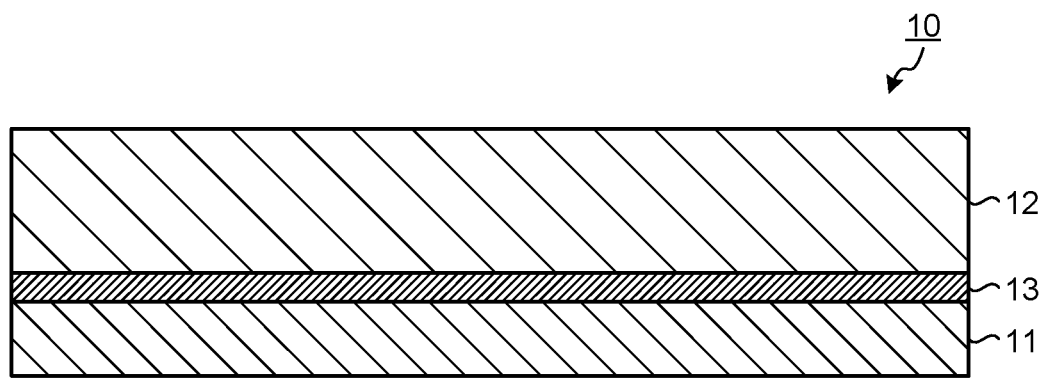
FIG. 2 is a cross-sectional view schematically illustrating an example of a layered body used in production of polarizing plates of the first to third embodiments.

FIG. 2 is a cross-sectional view schematically illustrating a layered body 10. As illustrated in FIG. 2, the layered body 10 includes a polarizer material film 11 and an unstretched substrate film 12. In this embodiment, the layered body 10 includes an adhesive layer 13 that is provided between the polarizer material film 11 and the unstretched substrate film 12. The layered body that is a material for the polarizing plate of the present invention may have a configuration without an adhesive layer. For the sake of distinguishing a layered body before a stretching treatment in a step of producing a polarizing plate from a layered body after the stretching treatment in the step of producing a polarizing plate in this application, the former may be called "layered body", and the latter may be called "stretched layered body".

[2.1. Polarizer Material Film]

The polarizer material film included in the layered body is a film which can form a polarizer as a result of stretching of the layered body (film for a polarizer). In the present invention, the polarizer material film may be a film having a phase difference Re1 in an in-plane direction of 10 nm or more and a thickness T1 of 40 μm or less.

The polarizer material film is a film obtained by stretching a primary film. The stretching of the primary film may be performed so that the Re1 and T1 of the polarizer material film are adjusted to desired values.

In the present invention, the primary film is not particularly limited and may be one capable of achieving the object of the present invention. The primary film may be a film containing a material constituting the polarizer. The primary film is preferably a film of a polyvinyl alcohol resin in terms of high cost performance.

In the present invention, the polyvinyl alcohol resin (hereinafter sometimes abbreviated as PVA) is not necessarily limited. In terms of availability and the like, it is preferable to use a product obtained by saponification of polyvinyl acetate obtained by polymerization of vinyl acetate. From the viewpoint of excellent stretching property and excellent polarization performance of the film to be obtained, it is preferable that the polymerization degree of PVA falls within a range of 500 to 8,000 and the saponification degree thereof is 90% by mole or more. Herein, the polymerization degree is an average polymerization degree measured in accordance with the description of JIS K6726-1994, and the saponification degree is a value measured in accordance with the description of JIS K6726-1994. The range of the polymerization degree is more preferably from 1,000 to 6,000, and further preferably from 1,500 to 4,000. The range of the saponification degree is more preferably 95% by mole or more, and further preferably 99% by mole or more. PVA may be a copolymer of vinyl acetate and a copolymerizable monomer or a graft polymer as long as the advantageous effects of the present invention are adversely affected.

In the present invention, a method for producing a primary film of PVA is not particularly limited, and the primary film of PVA may be produced by a publicly known method. Examples of the optional methods to be adopted may include a casting film formation method, a wet film formation method (discharging into a poor solvent), a dry-wet film formation method, a gelation film formation method (a method in which a PVA aqueous solution is cooled and once gelled, and then the solvent is extracted and removed to obtain the primary film of PVA), which use a PVA solution obtained by dissolving PVA in a solvent as a film formation stock solution; a method based on a combination thereof; and a melt-extrusion film formation method using a film stock solution obtained by melting PVA containing a solvent. Among these methods, the casting film formation method and the melt-extrusion film formation method are preferable since a highly transparent, less colored primary film of PVA is obtained. The melt-extrusion film formation method is more preferable.

In the present invention, in order to improve the mechanical properties, the process-passing property in secondary processing, and the like, it is preferable that the primary film of PVA contains a plasticizer including a polyhydric alcohol such as glycerin in an amount of 0.01 to 30% by weight relative to the amount of PVA. In order to improve the handling property, the film appearance, and the like, it is preferable that the primary film of PVA contains a surfactant such as an anionic surfactant or a nonionic surfactant in an amount of 0.01 to 1% by weight relative to the amount of PVA.

If necessary the primary film of PVA may further contain other components such as an antioxidant, an ultraviolet absorber, a lubricant, a pH adjuster, inorganic substance particles, a colorant, an antiseptic, a mildewproofing agent, a polymer compound other than the aforementioned components, and a moisture content, within a range that does not impair the advantageous effects of the present invention. The primary film of PVA may contain one type or two or more types of these optional components.

The thickness of the primary film is preferably 50 μm or less, more preferably 40 μm or less, and further preferably 30 μm or less, and is preferably 5 μm or more, more preferably 10 μm or more, and further preferably 15 μm or more. When the thickness of the primary film is equal to or more than the lower limit value of the aforementioned range, a polarizing plate having a sufficiently high polarization degree can be obtained. When it is equal to or less than the upper limit value of the aforementioned range, the resistance of a polarizing plate against bending can be effectively enhanced.

The polarizer material film is obtained by subjecting the primary film to a stretching treatment. Examples of a method for the stretching treatment may include dry stretching and wet stretching. Since dry stretching is simpler than wet stretching in terms of equipment and process, the polarizer material film is preferably one obtained by dry stretching. As dry stretching, a stretching method such as a tenter stretching, a floating stretching, and a thermal roll stretching may be used. The dry stretching is a stretching treatment method in which stretching is performed in an atmosphere of a gas of high temperature (for example, 100° C. or higher). Examples of the gas used in the dry stretching may include air.

The stretching conditions under which the primary film is stretched to obtain the polarizer material film may be appropriately selected so that a desired polarizer material film is obtained. For example, the manner of stretching when the primary film is stretched to obtain the polarizer material film may be any optional manner of uniaxial stretching, biaxial stretching, and the like. When the primary film is a long-length film, the stretching direction may be any of a longitudinal direction (a direction parallel to the lengthwise direction of the long-length film), a transverse direction (a direction parallel to the widthwise direction of the long-length film), and an oblique direction (a direction that is not the longitudinal direction or the transverse direction).

The stretching ratio X upon the stretching of the primary film for obtaining the polarizer material film is preferably 1.5 or more, more preferably 2.0 or more, and further preferably 2.5 or more, and is preferably 5.5 or less, more preferably 4.5 or less, and further preferably 3.5 or less. That is, the polarizer material film is preferably a film obtained by stretching at a stretching ratio X of 1.5 or more and 5.5 or less, more preferably a film obtained by stretching at a stretching ratio X of 2.0 or more and 4.5 or less, and further preferably a film obtained by stretching at a stretching ratio X of 2.5 or more and 3.5 or less. When the stretching ratio X is equal to or less than the upper limit value of the aforementioned range, occurrence of rupture when the primary film is stretched to obtain the polarizer material film can be prevented. When the stretching ratio X is equal to or more than the lower limit value of the aforementioned range, the stretching ratio when the layered body is stretched to obtain the polarizing plate can be decreased. When the primary film is stretched in two or more directions by biaxial stretching or the like, the stretching ratio X is a product of ratios of stretching in the respective directions.

When the primary film is subjected to dry stretching to obtain the polarizer material film, the stretching temperature is preferably 100° C. or higher, and more preferably 110° C. or higher, and is preferably 150° C. or lower, and more preferably 140° C. or lower. When the temperature of dry stretching falls within the aforementioned range, a polarizer material film having uniform thickness is obtained.

The thickness T1 of the polarizer material film in the layered body is 40 μm or less, preferably 30 μm or less, and more preferably 20 μm or less, and is preferably 3 μm or more, and more preferably 5 μm or more. When the thickness T1 of the polarizer material film is equal to or more than the lower limit value of the aforementioned range, a polarizing plate having a sufficiently high polarization degree can be obtained. When it is equal to or less than the upper limit value of the aforementioned range, the resistance of the polarizing plate to bending can be effectively enhanced.

The shape and size of the polarizer material film may be appropriately adjusted according to desired use. In terms of efficiency of production, it is preferable that the polarizer material film is a long-length film.

The phase difference Rel in the in-plane direction of the polarizer material film is preferably 10 nm or more, and more preferably 50 nm or more, and is preferably 500 nm or less, and more preferably 400 nm or less. When the phase difference Rel in the in-plane direction of the polarizer material film is equal to or more than the lower limit value of the aforementioned range, the stretching ratio when the layered body is subjected to a stretching treatment to obtain the polarizing plate is decreased, and thus the phase difference of the substrate after the stretching treatment can be kept at a low level. When the phase difference Rel in the in-plane direction of the polarizer material film is equal to or less than the upper limit value of the aforementioned range, the stretching ratio when the primary film is stretched to obtain the polarizer material film can be decreased, and thus problems such as occurrence of wrinkle in stretching the primary film alone can be avoided.

The Nz factor of the polarizer material film in the layered body is preferably 0.95 or more, and more preferably 0.99 or more, and is preferably 1.5 or less, and more preferably 1.4 or less. When the Nz factor falls within the aforementioned range, a polarizer having a sufficient polarization degree can be obtained.

[2.2. Substrate Film]

In the layered body, an unstretched film is used as the substrate film. The unstretched substrate film in the layered body may become a substrate film in the polarizing plate as a result of the stretching of the layered body. Therefore, in the description of the present application, the "substrate film" included in the layered body is the substrate film in the unstretched state, and the "substrate film" included in the polarizing plate is the substrate film in the stretched state as a result of the stretching of the layered body.

The thickness of the substrate film in the layered body is preferably 5 μm or more, and more preferably 10 μm or more, and is preferably 50 μm or less, and more preferably 30 μm or less. When the thickness of the substrate film in the layered body is equal to or more than the lower limit value of the aforementioned range, a layered body having a good bonded surface state can be obtained. When the thickness is equal to or less than the upper limit value of the aforementioned range, the phase difference generated in the substrate film when the layered body is stretched to obtain the polarizing plate can be reduced.

The substrate film is formed of a resin. The resin forming the substrate film is not particularly limited. The substrate film is preferably a film formed of at least one type selected from a cycloolefin resin, an amorphous polyester resin, a polyolefin resin, and an acrylic resin, and more preferably a film formed of a cycloolefin resin.

Preferable cycloolefin resins forming the substrate film are those containing a cycloolefin-based polymer, and the cycloolefin-based polymer is a hydrogenated product of a ring opening polymer of a norbornene-based monomer, an addition copolymer of a norbornene-based monomer and an α-olefin, and a hydrogenated product thereof. Among these, preferable cycloolefin-based polymers are an addition copolymer of a norbornene-based monomer and an α-olefin and a hydrogenated product thereof from the viewpoint of low tendency to express a phase difference even when stretched. Examples of the hydrogenated product of the ring opening polymer of a norbornene-based monomer, the addition copolymer of a norbornene-based monomer and an α-olefin, and/or the hydrogenated product thereof may include the polymer compounds described in Japanese Patent Application Laid-Open No. Hei. 2-180976 A, Japanese Patent Application Laid-Open No. Hei. 3-109418 A, Japanese Patent Application Laid-Open No. Hei. 3-223328 A, Japanese Patent Application Laid-Open No. Hei. 4-301415 A, Japanese Patent Application Laid-Open No. Hei. 5-212828 A, and Japanese Patent Application Laid-Open No. Hei. 7-145213 A.

The cycloolefin resin forming the substrate film preferably contains a cycloolefin-based polymer, and the cycloolefin-based polymer is composed of a hydrogenated product of a block copolymer obtained by hydrogenating carbon-carbon unsaturated bonds in the main chain and the side chain and carbon-carbon unsaturated bonds in aromatic rings of a block copolymer [D] composed of: a polymer block [A] containing a repeating unit [I] derived from an aromatic vinyl compound as a main component; and a polymer block [B] containing the repeating unit [I] derived from an aromatic vinyl compound and a repeating unit [II] derived from a chain conjugated diene compound as a main component or a polymer block [C] containing the repeating unit [II] derived from a chain conjugated diene compound as a main component. Examples of such a hydrogenated product of the block copolymer may include polymer compounds described in International Publication No. 2000/32646, International Publication No. 2001/081957, Japanese Patent Application Laid-Open No. 2002-105151 A, Japanese Patent Application Laid-Open No. 2006-195242 A, Japanese Patent Application Laid-Open No. 2011-13378 A, and International Publication No. 2015/002020.

[2.2.1. Plasticizer and Softener]

In the present invention, it is preferable that the substrate film contains a plasticizer and/or a softener (one or both of the plasticizer and the softener). When the substrate film contains a plasticizer and/or a softener, it is possible to reduce the phase difference generated in the substrate film when the layered body is stretched to obtain a polarizing plate.

As the plasticizer and the softener, those which can be uniformly dissolved or dispersed in the resin forming the substrate film may be used. Specific examples of the plasticizer and softener may include an ester-based plasticizer such as an ester-based plasticizer composed of a polyhydric alcohol and a monovalent carboxylic acid (hereinafter referred to as a "polyhydric alcohol ester-based plasticizer") and an ester-based plasticizer composed of a polyvalent carboxylic acid and a monohydric alcohol (hereinafter referred to as "polyvalent carboxylic acid ester-based plasticizer"), as well as a phosphoric acid ester-based plasticizer, a hydrocarbon ester-based plasticizer, and other polymer softeners.

Examples of the polyhydric alcohol which is a raw material for the ester-based plasticizer preferably used in the present invention are not particularly limited, and may preferably include ethylene glycol, glycerin, and trimethylolpropane.

Examples of the polyhydric alcohol ester-based plasticizer may include an ethylene glycol ester-based plasticizer, a glycerin ester-based plasticizer, and other polyhydric alcohol ester-based plasticizers.

Examples of the polyvalent carboxylic acid ester-based plasticizer may include a dicarboxylic acid ester-based plasticizer and other polyvalent carboxylic acid ester-based plasticizers.

Specific examples of the phosphoric acid ester-based plasticizer may include a phosphoric acid alkyl ester such as triacetyl phosphate and tributyl phosphate; a phosphoric acid cycloalkyl ester such as tricyclopentyl phosphate and cyclohexyl phosphate; and a phosphoric acid aryl ester such as triphenyl phosphate and tricresyl phosphate.

Specific examples of the hydrocarbon ester-based plasticizer may include glucose pentaacetate, glucose pentapropionate, glucose pentabutyrate, saccharose octaacetate, and saccharose octabenzoate, among which saccharose octaacetate is more preferable.

Examples of the polymer softener may include an aliphatic hydrocarbon polymer, an alicyclic hydrocarbon polymer, an acryl-based polymer such as polyethylacrylate, polymethylmethacrylate, a copolymer of methyl methacrylate and 2-hydroxyethyl methacrylate, and a copolymer of methyl methacrylate, methyl acrylate and 2-hydroxyethyl methacrylate; a vinyl-based polymer such as polyvinyl isobutyl ether and poly(N-vinylpyrrolidone); a styrene-based polymer such as polystyrene and poly(4-hydroxystyrene); polyester such as polybutylene succinate, polyethylene terephthalate, and polyethylene naphthalate; polyether such as polyethylene oxide and polypropylene oxide; and polyamide, polyurethane, and polyurea.

Specific examples of the aliphatic hydrocarbon-based polymer may include a low molecular weight polymer such as polyisobutylene, polybutene, poly-4-methylpentene, poly-1-octene, and an ethylene α-olefin copolymer and hydrogenated products of these; and a low molecular weight polymer such as polyisoprene, and a polyisoprene-butadiene copolymer and hydrogenated products of these. The aliphatic hydrocarbon-based polymer preferably has a number-average molecular weight of 300 to 5,000 from the viewpoint of being easily dissolved or dispersed uniformly in the cycloolefin resin.

The polymer softener may be a homopolymer composed of one type of repeating unit or a copolymer having a plurality of repeating structures. Two or more of the aforementioned polymers may be used in combination.

In the present invention, as the plasticizer and/or the softener, an ester-based plasticizer, an aliphatic hydrocarbon-based polymer, and a mixture thereof are preferable.

The ratio of the plasticizer and/or softener (hereinafter also referred to as "plasticizer or the like") in the substrate film is preferably 0.2 part by weight or more, more preferably 0.5 part by weight or more, and still more preferably 1.0 part by weight or more, and is preferably 40 parts by weight or less, and more preferably 30 parts by weight or less, relative to 100 parts by weight of the resin forming the substrate film. By setting the ratio of the plasticizer or the like within the aforementioned range, phase difference expression of the substrate film can be made at a sufficiently low level even after the step of producing the polarizing plate including the stretching treatment.

[2.2.2. Optional Components]

The substrate film may contain optional components in addition to the resin and the plasticizer and the like. Examples of the optional components may include a stabilizer such as an antioxidant, an ultraviolet absorber, and a light stabilizer; a resin modifier such as a lubricant; a colorant such as a dye and a pigment; and an antistatic agent. As these agents added, one type may be solely used, and two or more types may be used in combination, and the added amount thereof is appropriately selected within a range that does not impair the object of the present invention.

[3. Method for Producing Substrate Film]

The substrate film may be produced by molding a composition (hereinafter also referred to as "resin composition") containing components for forming the substrate film (a resin and a component to be added if necessary) into a film shape by any optional molding method.

Examples of a method for molding the resin composition into a film shape may include melt-extrusion molding. A melt-extrusion step may be performed by a method in which the resin composition is melted with an extruder and extruded from a T-die attached to the extruder into a film shape, and the extruded film is brought into close contact with one or more cooling rollers to be molded, and then taken up. The molding conditions in melt-extrusion molding may be appropriately set according to conditions such as the composition and molecular weight of the resin composition used and the like.

[4. Method for Producing Layered Body]

Subsequently, an example of a method for producing the layered body will be described.

The method for producing the layered body include a step (a) of stretching the primary film in one or more directions to obtain a polarizer material film, and a step (b) of providing a substrate film on the polarizer material film to obtain the layered body.

Figure 3:
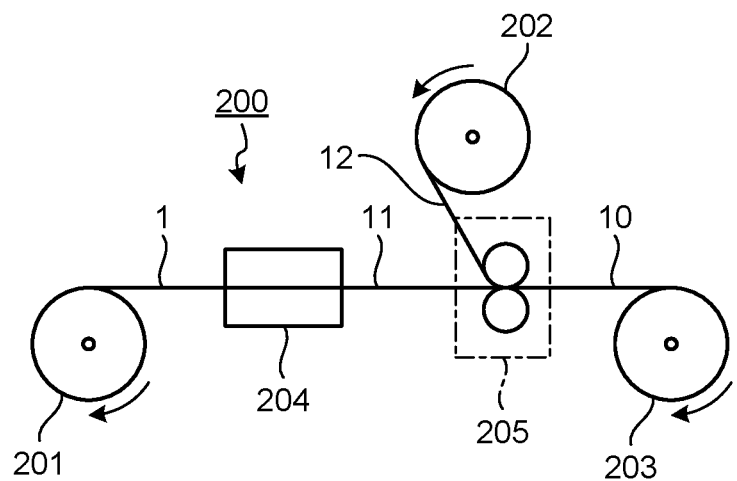
FIG. 3 is a view schematically illustrating an example of steps of producing a layered body used in production of the polarizing plates of the first to third embodiments.

FIG. 3 is a schematic view schematically illustrating an example of a production apparatus 200 for forming the substrate film 12 on the polarizer material film 11 to produce the layered body 10. The production apparatus 200 is provided with feeding devices 201 and 202, a stretching device 204, a bonding device 205, and a winding device 203.

As illustrated in FIG. 3, a primary film 12 fed from the feeding device 201 is conveyed to the stretching device 204, and is subjected to a stretching treatment in the stretching device 204, to obtain the polarizer material film 11 (step (a)). The polarizer material film 11 thus obtained is conveyed to the bonding device 205, an adhesive is applied onto the polarizer material film 11 in the bonding device 205, and the polarizer material film 11 is bonded to the substrate film 12 fed from the feeding device 202 to obtain the layered body 10 (step (b)). The layered body 10 thus produced is wound up by the winding device 203 to thereby constitute a form of a roll, and the roll can be subjected to further processing. In this embodiment, the adhesive is used in the step (b), but the adhesive is an optional component in the present invention. Alternatively, in the step (b), the adhesive may be applied onto the substrate film, and the substrate film may be then bonded to the polarizer material film. The application of the adhesive between the polarizer material film and the substrate film is preferable since problems such as separation between these films can thereby be prevented. However, when sufficient adhesion force between the polarizer material film and the substrate film is obtained without the adhesive, the adhesive does not have to be used.

It is preferable that the stretching treatment of the primary film in the step (a) is performed in accordance with the methods and conditions (the method for a stretching treatment, the manner of stretching, the stretching ratio, the stretching temperature) described in

[2.1. Polarizer Material Film].

In the step (b), there is no particular limitation to the adhesive for bonding the polarizer material film 11 and the substrate film 12. Examples thereof may include an acryl-based adhesive, a urethane-based adhesive, a polyester-based adhesive, a polyvinyl alcohol-based adhesive, a polyolefin-based adhesive, a modified polyolefin-based adhesive, a polyvinyl alkyl ether-based adhesive, a rubber-based adhesive, a vinyl chloride-vinyl acetate-based adhesive, an SEBS (styrene-ethylene-butylene-styrene copolymer) based adhesive, an ethylene-based adhesive such as an ethylene-styrene copolymer, and an acrylic acid ester-based adhesive such as an ethylene-(meth)acrylic acid methyl ester copolymer and an ethylene-(meth)acrylic acid ethyl ester copolymer.

The surface to be bonded to the polarizer material film of the substrate film may be subjected to an adhesion facilitating treatment such as a corona treatment, a saponification treatment, a primer treatment, or an anchor coating treatment.

The layered body 10 may be used as a material for producing the polarizing plate of this embodiment. In this case, the layered body is subjected to treatments such as a stretching treatment and a dyeing treatment, to form the polarizing plate.

[5. Method for Producing Polarizing Plate]

The polarizing plate of the present invention may be produced by stretching the layered body. In production of the polarizing plate, an optional step may be performed in addition to the stretching of the layered body. Specifically, a step of dyeing the polarizer material film with a dichroic material may be performed. More specifically, the method for producing the polarizing plate may include the aforementioned steps (a) and (b), a step (c) of stretching the layered body, which has been obtained by the steps (a) and (b), in one or more directions, and a step (d) of dyeing the polarizer material film with a dichroic material. The step (d) may be performed at any optional stage. For example, the step (d) may be performed simultaneously with the step (c). Alternatively, the step (d) may be performed before the step (c) or before the step (b).

Figure 4:
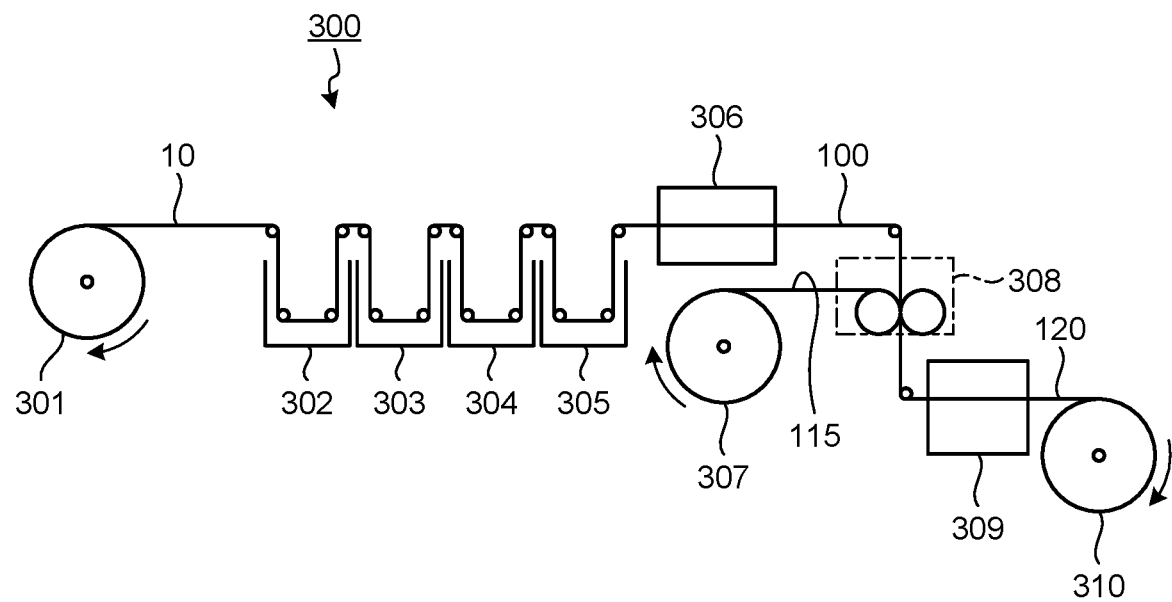
FIG. 4 is a view schematically illustrating an example of steps of producing the polarizing plates of the first to third embodiments.

FIG. 4 is a schematic view schematically illustrating an example of a production apparatus 300 for producing the polarizing plate 100 of this embodiment by performing a stretching treatment and the other optional treatment of the layered body 10. The production apparatus 300 is provided with feeding devices 301 and 307, treatment devices 302 to 305, drying devices 306 and 309, a bonding device 308, and a winding device 310.

In the example of FIG. 4, the layered body 10 fed from the feeding device 301 is conveyed to the treatment devices 302 to 305, and subjected to treatments such as a dyeing treatment (step (d)) with a dichroic material and a stretching treatment (step (c)) of stretching the layered body. After drying the layered body after the treatments in the drying device 306, the polarizing plate 100 is obtained.

The stretching ratio of the layered body in the step (c) is preferably 1.2 or more, and more preferably 1.5 or more, and preferably 5.0 or less, and more preferably 4.0 or less. When the stretching ratio of the layered body is equal to or less than the upper limit value of the aforementioned range, expression of the phase difference of the substrate film can be decreased even after the step of producing the polarizing plate including the stretching treatment, and occurrence of rupture of the polarizing plate can be prevented. When the stretching ratio is equal to or more than the lower limit value of the aforementioned range, a polarizing plate having sufficient polarization performance can be obtained. The method for the stretching treatment when the polarizing plate is produced using the layered body of the present invention is not particularly limited, and wet stretching is preferable.

The stretching temperature of the layered body in the step (c) is not particularly limited. For example, when a polyvinyl alcohol-based resin is used as the material for the polarizer, the specific stretching temperature is preferably 50° C. or higher, more preferably 55° C. or higher, and particularly preferably 60° C. or higher, and is preferably 160° C. or lower, more preferably 120° C. or lower, and particularly preferably 110° C. or lower. When the stretching temperature is equal to or more than the lower limit value of the aforementioned range, stretching can be smoothly performed. When it is equal to or less than the upper limit value of the aforementioned range, effective orientation can be performed by the stretching. The aforementioned range of stretching temperature is preferable for both the dry stretching method and the wet stretching method, although the range is particularly preferable for the case of the wet stretching.

The stretching treatment of the layered body in the step (c) is a treatment including stretching in at least one direction, and may include stretching only in one direction or stretching in two or more directions. The stretching treatment of the layered body is preferably uniaxial stretching, further preferably free end uniaxial stretching, and particularly preferably free end uniaxial stretching in a longitudinal direction. In the stretching treatment including only stretching in one direction, stretching is performed so that the stretching ratio of the stretching falls within the aforementioned range of the specific stretching ratio. In the stretching treatment including stretching in two or more directions, stretching is performed so that a product of the stretching ratios of the stretching in the respective directions falls within the aforementioned range of the specific stretching ratio. In the stretching treatment including stretching in two or more directions, stretching in the respective directions may be performed simultaneously or sequentially.

Examples of the dichroic material with which the polarizer material film is dyed in the step (d) may include iodine and an organic dye. The dyeing method using the dichroic material may be any optional method. For example, dyeing may be performed by immersing the layer of the polarizer material film in a dyeing solution containing the dichroic material. When iodine is used as the dichroic material, the dyeing solution may contain an iodide such as potassium iodide from the viewpoint of enhancing the dyeing efficiency.

[6. Properties of Respective Layers in Polarizing Plate]

The thickness T of the polarizer in the polarizing plate is 20 μm or less. In the present invention, the thickness T of the polarizer is preferably 15 μm or less, and more preferably 12 μm or less, and is preferably 1 μm or more, and more preferably 3 μm or more. When the thickness T of the polarizer in the polarizing plate is equal to or less than the upper limit value, the thickness of the polarizing plate can be reduced. When it is equal to or more than the lower limit value, a polarizing plate having a sufficiently high polarization degree can be obtained.

The polarizer in the polarizing plate includes a dichroic material. Examples of the dichroic material may include a material exemplified as the dichroic material for dyeing the polarizer material film in the step (d).

The phase difference Re in the in-plane direction of the substrate film in the polarizing plate is 20 nm or less. The phase difference Re in the in-plane direction of the substrate film is preferably 15 nm or less, and more preferably 10 nm or less, and is preferably 0 nm or more. When the phase difference Re in the in-plane direction of the substrate film in the polarizing plate falls within the aforementioned range, phase difference expression of the substrate film can be made at a sufficiently low level even after the step of producing the polarizing plate including the stretching treatment.

The values of T and Re in the polarizing plate may be adjusted within the above preferable ranges by appropriately setting the conditions for the production.

[7. Effects of this Embodiment]

According to this embodiment, the polarizing plate is obtained by stretching the layered body including the polarizer material film that is a previously stretched film. Therefore, the stretching ratio upon stretching the layered body to produce the polarizing plate can be decreased. Consequently, expression of the phase difference of the substrate film after the stretching treatment of the layered body can be suppressed. As a result, the substrate film does not have to be peeled off and the substrate film as it is can be used as a protective film on one surface of the polarizer, and accordingly amount of waste materials can be decreased. In this embodiment, the previously stretched film is used as the polarizer material film. Therefore, unlike the cases wherein an unstretched polarizer material film is used, a substrate film having an extremely wide width is unnecessary upon attaching the substrate film to form the layered body, and thereby production of the polarizing plate can be efficiently performed. Consequently, this embodiment can provide a polarizing plate in which the substrate film can be used also as a protective film and which can be efficiently produced even when the polarizing plate is thin.

Second Embodiment: Polarizing Plate

A polarizing plate according to a second embodiment of the present invention will be described with reference to FIG. 5.

Figure 5:
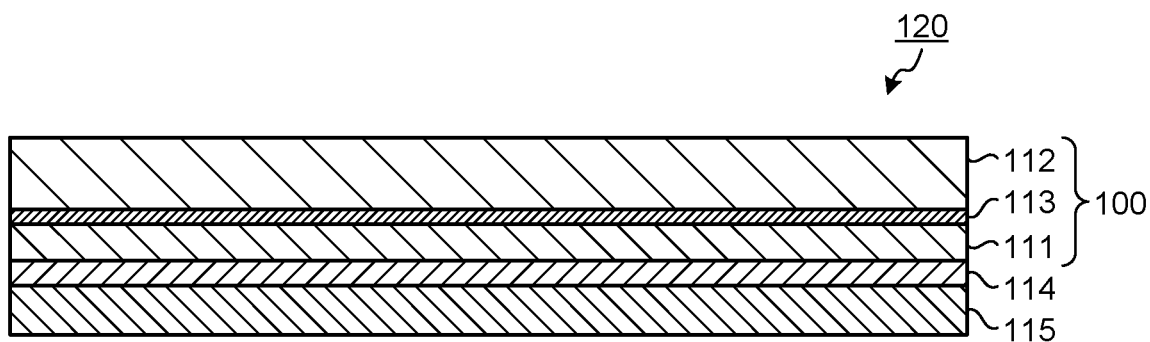
FIG. 5 is a cross-sectional view schematically illustrating the polarizing plate according to the second embodiment of the present invention.

FIG. 5 is a cross-sectional view schematically illustrating a polarizing plate 120 according to the second embodiment of the present invention. In this polarizing plate 120, as illustrated in FIG. 5, a substrate film 112 is layered on one surface (the upper surface in the drawing) of a polarizer 111, and a protective film 115 is layered on the other surface side (the lower surface in the drawing) of the polarizer 111. In FIG. 5, reference numerals 113 and 114 each denote an adhesive layer. As the adhesive for bonding the protective film to the polarizer, an adhesive that is the same as that for bonding the substrate film to the polarizer may be used.

The method for producing the polarizing plate 120 according to this embodiment may include the steps (a) and (b) described above, the step (c) of stretching the layered body, which has been obtained through these steps (a) and (b), in one or more directions, and the step (d) of dyeing the polarizing material film with a dichroic material, and may further include a step (e1) of bonding a protective film directly or via an adhesive to the polarizer after the step (c).

Specifically, as illustrated in FIG. 4, the polarizing plate 100 of the first embodiment is conveyed to a bonding device 308, an adhesive is applied onto the surface of the polarizer 111 on the side where the substrate film 112 is not layered, and the protective film 115 fed from a feeding device 307 is bonded thereto, to thereby obtain the polarizing plate 120 including the protective film 115 (step (e1)). The polarizing plate 120 thus produced is wound up by a winding device 310 to thereby constitute a form of a roll, and the roll can be subjected to further processing.

Similarly to the first embodiment, the polarizing plate of this embodiment can also be obtained by stretching a layered body including a polarizer material film which is a previously stretched film, and thus has the same functioning effect as in the first embodiment.

Third Embodiment: Polarizing Plate

A polarizing plate according to a third embodiment of the present invention will be described with reference to FIG. 6.

Figure 6:
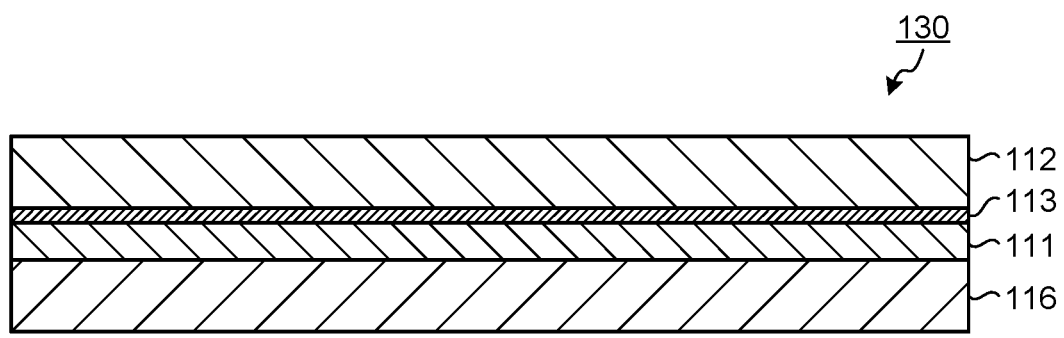
FIG. 6 is a cross-sectional view schematically illustrating the polarizing plate according to the third embodiment of the present invention.

FIG. 6 is a cross-sectional view schematically illustrating a polarizing plate 130 according to the third embodiment of the present invention. In this polarizing plate 130, as illustrated in FIG. 6, a substrate film 112 is layered on one surface (the upper surface in the drawing) of a polarizer 111, and an adhesive layer 116 is layered on the other surface side (the lower surface in the drawing) of the polarizer 111.

The method for producing a polarizing plate of this embodiment includes the steps (a) and (b) described above, the step (c) of stretching the layered body, which has been obtained through these steps (a) and (b), in one or more directions, and the step (d) of dyeing the polarizing material film with a dichroic material, and further includes a step (e2) of providing a tackiness agent layer on the polarizer after the step (c).

As the tackiness agent forming the tackiness agent layer, various commercially available tackiness agents, for example, a tackiness agent containing an acrylic polymer as a polymer serving as a main component may be used.

The polarizing plate 130 according to the third embodiment is obtained, for example, by transferring a tackiness agent layer from a a commercially available film having tackiness agent layer (for example, "MASTACK Series" manufactured by Fujimori Kogyo Co., Ltd.) to a surface of the polarizer 111 of the polarizing plate 100 of the first embodiment, on which the substrate film 112 is not layered, to form a tackiness agent layer.

Similarly to the first embodiment, the polarizing plate of this embodiment is also obtained by stretching a layered body including a polarizer material film which is a previously stretched film, and thus has the same functioning effect as in the first embodiment.

<Display Device>

The polarizing plate of the present invention may serve as a material for a liquid crystal display device, an EL display device, and the like.

[Summary of Liquid Crystal Display Device]

The display device of the present invention includes two substrates, a liquid crystal layer positioned therebetween, and the polarizing plate of the present invention which is disposed on at least one of the outer sides of the two substrates. The display device may be produced by disposing the polarizing plate of the present invention on a liquid crystal panel.

Generally, a liquid crystal display device includes a light source, a light source-side polarizing plate, a liquid crystal cell, and a viewing-side polarizing plate in this order, and the polarizing plate of the present invention may be used for any of the light source-side polarizing plate and the viewing-side polarizing plate.

Examples of the driving method of the liquid crystal cell may include an in-plane switching (IPS) mode, a vertical alignment (VA) mode, a multi-domain vertical alignment (MVA) mode, a continuous spin wheel alignment (CPA) mode, a hybrid alignment nematic (HAN) mode, a twisted nematic (TN) mode, a super-twisted nematic (STN) mode, and an optical compensated bend (OCB) mode.

Hereinafter, a liquid crystal display device according to fourth and fifth embodiments will be described.

Fourth Embodiment: Liquid Crystal Display Device

A display device according to a fourth embodiment including the polarizing plate of the present invention will be described with reference to FIG. 7.

Figure 7:
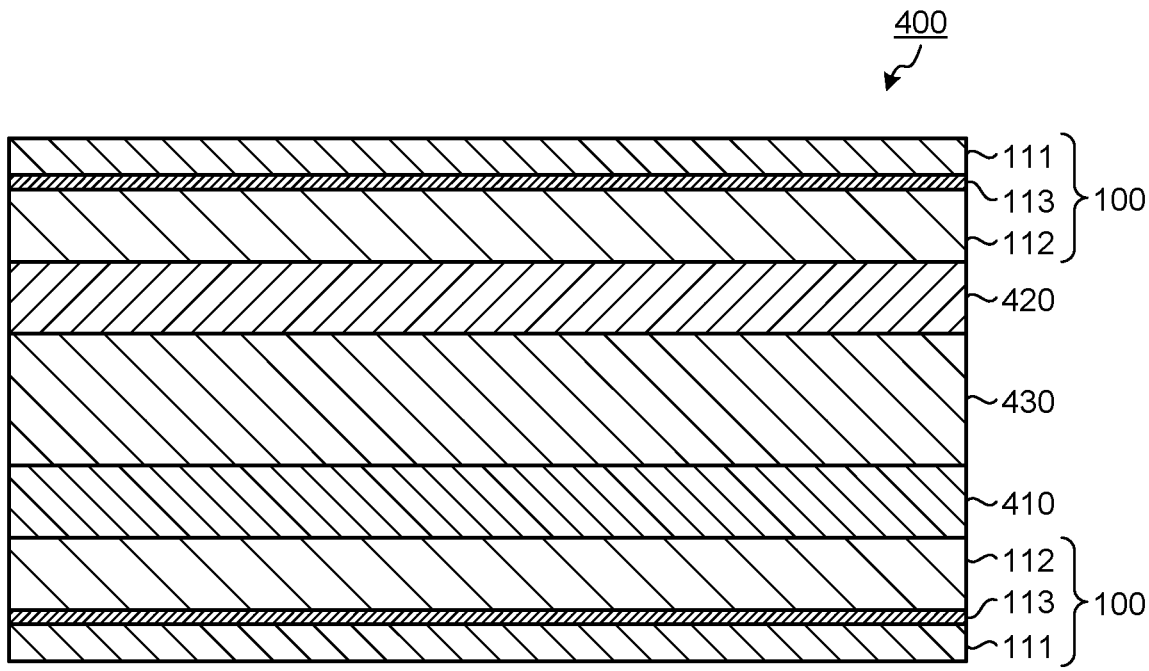
FIG. 7 is a cross-sectional view schematically illustrating a polarizing plate according to a fourth embodiment of the present invention.

FIG. 7 is a cross-sectional view schematically illustrating a liquid crystal display device 400 according to the fourth embodiment. As illustrated in FIG. 7, the liquid crystal display device 400 includes two substrates 410 and 420, a liquid crystal layer 430 positioned therebetween, and polarizing plates 100 and 100 disposed on the outer side of the two substrates 410 and 420, respectively. The two polarizing plates 100 are each the polarizing plate of the first embodiment. As illustrated in FIG. 7, the two polarizing plates 100 are layered so that the substrate film 112 is disposed between the polarizer 111 and the liquid crystal layer 430.

According to this embodiment, it is possible to provide a display device provided with the polarizing plate of the present invention in which the substrate film can be used also as a protective film and which can be efficiently produced even when the polarizing plate is thin.

Fifth Embodiment: Liquid Crystal Display Device

Figure 8:
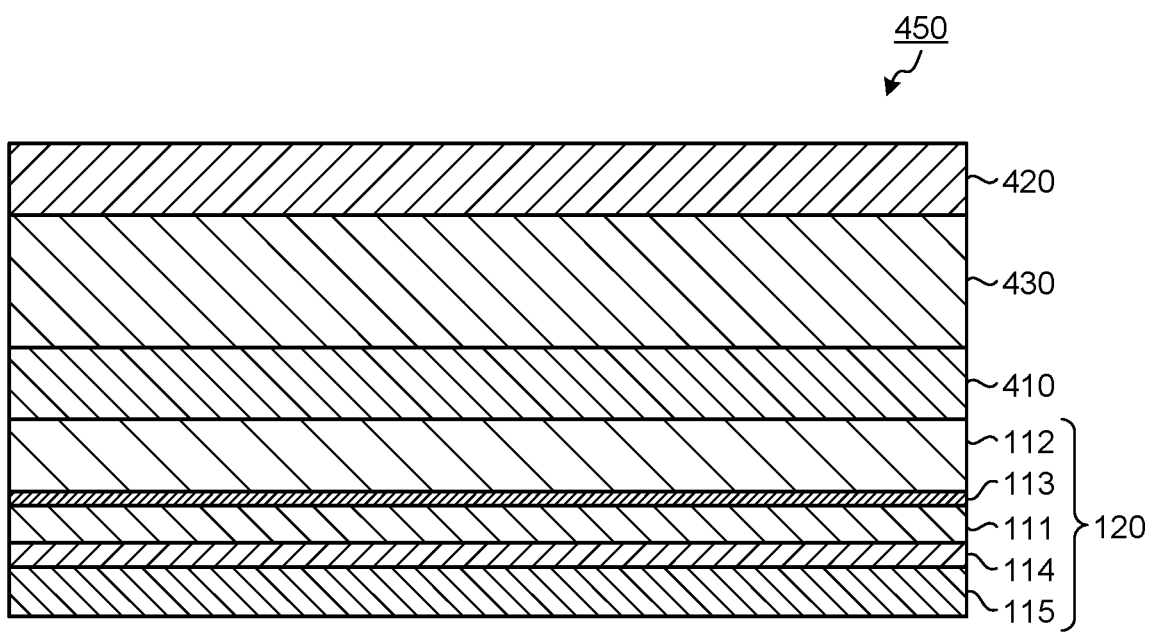
FIG. 8 is a cross-sectional view schematically illustrating a polarizing plate according to a fifth embodiment of the present invention.

A display device according to the fifth embodiment including the polarizing plate of the present invention will be described with reference to FIG. 8. FIG. 8 is a cross-sectional view schematically illustrating a liquid crystal display device 450 according to the fifth embodiment of the present invention. As illustrated in FIG. 8, the liquid crystal display device 450 includes two substrates 410 and 420, a liquid crystal layer 430 positioned therebetween, and a polarizing plate 120 disposed outside the lower substrate 410 (lower side in the drawing). The polarizing plate 120 is the polarizing plate of the second embodiment.

As illustrated in FIG. 8, the polarizing plate 120 is layered such that the substrate film 112 is disposed between the polarizer 111 and the liquid crystal layer 430.

According to this embodiment, it is possible to provide a display device provided with the polarizing plate of the present invention in which the substrate film can be used also as a protective film and which can be efficiently produced even when the polarizing plate is thin.

[Summary of EL Display Device]

The display device of the present invention includes two substrates, a light-emitting layer positioned therebetween, and a polarizing plate disposed on the outer side of one of the two substrates. The display device may be produced by layering the polarizing plate of the present invention on an organic EL panel or an inorganic EL panel.

Usually, an organic EL display device includes a substrate, a transparent electrode, a light-emitting layer, and a metal electrode layer in this order from the light-emitting side. The display device of the present invention includes the polarizing plate of the present invention on the light-emitting side of the substrate. Hereinafter, organic EL display devices according to sixth and seventh embodiments will be described in detail.

Sixth Embodiment: Organic EL Display Device

Figure 9:
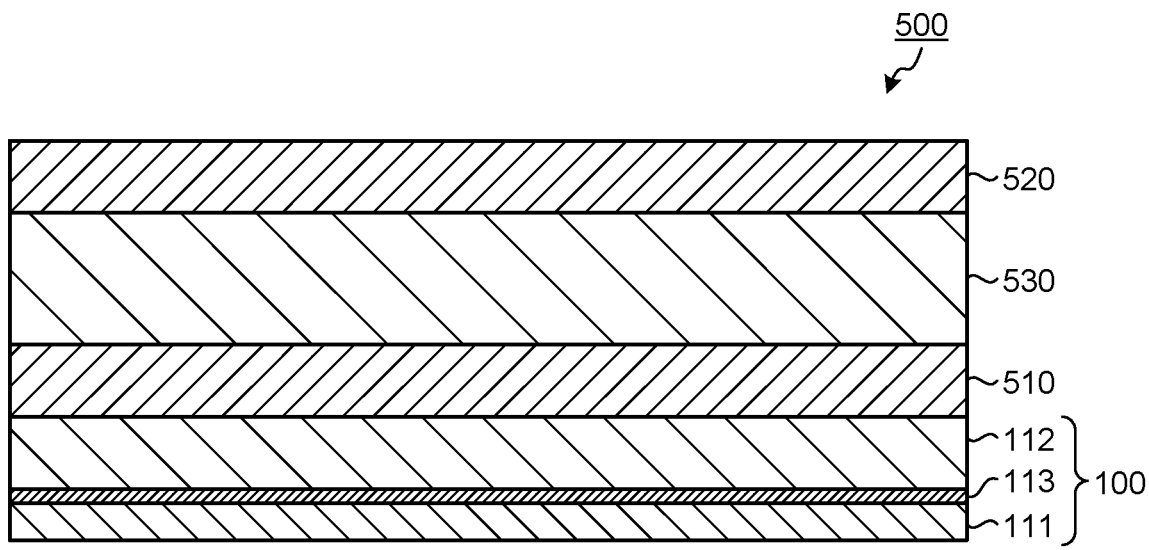
FIG. 9 is a cross-sectional view schematically illustrating a polarizing plate according to a sixth embodiment of the present invention.

A display device according to a sixth embodiment including the polarizing plate of the present invention will be described with reference to FIG. 9. FIG. 9 is a cross-sectional view schematically illustrating an organic EL display device 500 according to the sixth embodiment of the present invention. The organic EL display device 500 includes two substrates 510 and 520, a light-emitting layer 530 positioned therebetween, and a polarizing plate 100 disposed on the outer side of the lower substrate 510 (lower side in the drawing). The polarizing plate 100 is the polarizing plate of the first embodiment.

As illustrated in FIG. 9, the polarizing plate 100 is layered such that the substrate film 112 is disposed between the polarizer 111 and the light-emitting layer 530.

According to this embodiment, it is possible to provide a display device provided with the polarizing plate of the present invention in which the substrate film can be used also as a protective film and which can be efficiently produced even when the polarizing plate is thin.

Seventh Embodiment: Organic EL Display Device

Figure 10:
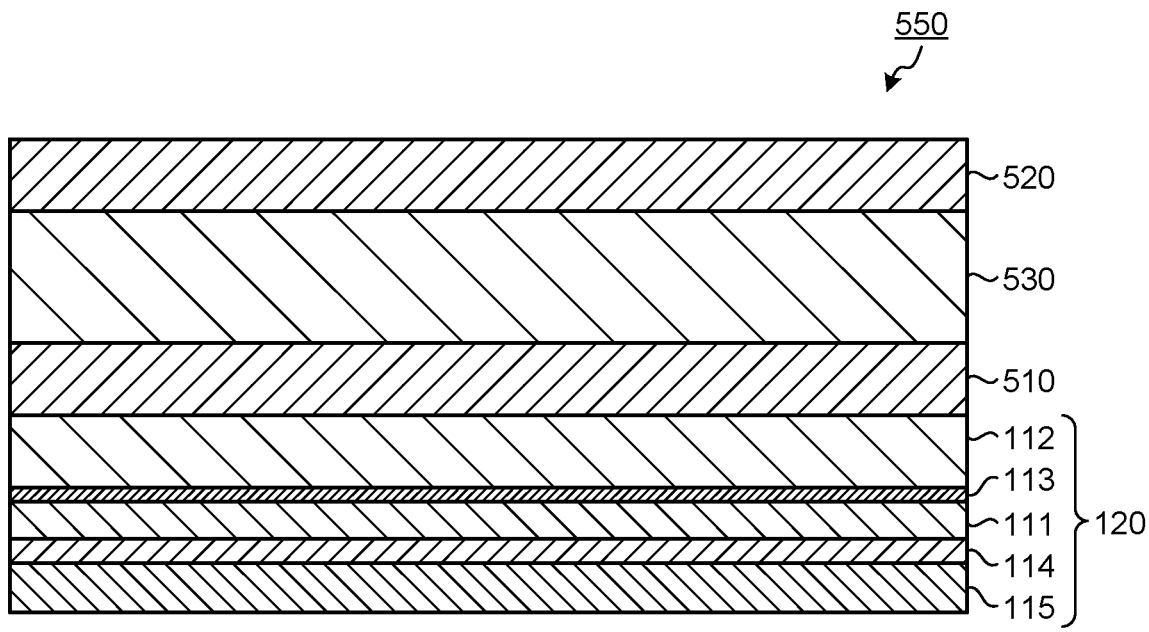
FIG. 10 is a cross-sectional view schematically illustrating a polarizing plate according to a seventh embodiment of the present invention.

A display device according to a seventh embodiment including the polarizing plate of the present invention will be described with reference to FIG. 10. FIG. 10 is a cross-sectional view schematically illustrating an organic EL display device 550 according to the seventh embodiment of the present invention. The organic EL display device 550 includes two substrates 510 and 520, a light-emitting layer 530 positioned between the two substrates 510 and 520, and a polarizing plate 120 disposed on the outer side of the lower substrate 510 (lower side in the drawing). The polarizing plate 120 is the polarizing plate of the second embodiment.

As illustrated in FIG. 10, the polarizing plate 120 is layered such that the substrate film 112 is disposed between the polarizer 111 and the light emitting layer 530.

According to this embodiment, it is possible to provide a display device provided with the polarizing plate of the present invention in which the substrate film can be used also as a protective film and which can be efficiently produced even when the polarizing plate is thin.

Other Embodiments (1) In the fourth embodiment, the polarizing plates of the first embodiment are used for the light source-side polarizing plate and the viewing-side polarizing plate, respectively. However, either one of the polarizing plates may be configured by the polarizing plate of the second or third embodiment, or two polarizing plates of second or third embodiment may be used.

(2) In the fifth embodiment, the polarizing plate of the second embodiment is used as one of the light source-side polarizing plate and the viewing-side polarizing plate. However, the polarizing plate of the first or third embodiment may also be used.

(3) The sixth and seventh embodiments show examples in which the polarizing plate of the first embodiment and the polarizing plate of the second embodiment are used in the organic EL display device, respectively, although the present invention is not limited thereto. For example, the polarizing plate of the present invention may be used for an inorganic EL display device, or the polarizing plate of the third embodiment may be used.

EXAMPLES

Hereinafter, the present invention will be described in more detail with reference to Examples and Comparative Examples. However, the present invention is not limited to the Examples described below. In the following description, "part" and "%" relating to the quantity ratio of components represent parts by weight, unless otherwise specified.

[Evaluation Method]
[Weight-Average Molecular Weight (Mw) and Molecular Weight Distribution (Mw/Mn)]

The molecular weights of the block copolymer and the hydrogenated product of the block copolymer were measured at 38° C. as a standard polystyrene-equivalent value by GPC using THF as an eluent. As the measurement device, HLC8020GPC manufactured by TOSOH CORPORATION was used.

[Hydrogenation Ratio]

The hydrogenation ratio of the hydrogenated product of a block copolymer was calculated by $^1$H-NMR spectrum or GPC analysis. In a region where the hydrogenation ratio was 99% or less, calculation was made on the basis of $^1$H-NMR spectrum measurement. In a region where the hydrogenation ratio exceeds 99%, calculation was made on the basis of the peak area ratio by GPC analysis with a UV detector and an RI detector.

[Method for Measuring In-Plane Phase Difference Re and Nz Factor]

Re and Rth were measured at a wavelength of 590 nm with a phase difference measurement device (product name "Axoscan" manufactured by Axometric), and Nz factor was determined therefrom.

[Method for Measuring Thickness]

The thickness of the primary film before and after stretching, the thickness of the substrate film, and the thickness of each layer contained in a polarizing plate were measured by the following method.

The polarizing plate was cut with a microtome, and a cross section thereof was then observed with TEM. The size in a thickness direction was measured at five positions, and the average of the measured values was adopted as the thickness.

[Evaluation of Bonded Surface State of Layered Body]

The layered body was observed by visual inspection. A case where a streak or a void did not occur was evaluated as "good", and a case where a streak or a void occurred was evaluated as "poor".

[Evaluation of Stretching Property]

Stability in the step of stretching the layered body to produce the polarizing plate was evaluated in accordance with the following criteria.

A: rupture did not occur (zero rupture in 10 film passage).

B: almost no rupture occurred (1 rupture in 10 film passage).

C: rupture frequently occurred, and it was unable to produce a polarizing plate.

[Evaluation of Black Color Shift]

A liquid-crystal display panel was detached from a commercially available IPS liquid crystal television, and a polarizing plate disposed on a viewing side was removed and, as a replacement thereof, the polarizing plate produced in each of Examples and Comparative Examples was bonded to the panel so that the substrate film was on a panel side. A polarizer without any protective film was bonded to the place that is adjacent to the polarizing plate produced in each of Examples and Comparative Examples, and a liquid crystal display device was re-assembled.

The panel was operated to be in a black display state (a state where black was displayed on the entire screen), and was visually observed in a direction of polar angle of 45° and azimuth angle of 45°. A case where a change in color tone was the same as that in a case of the polarizer without any protective film was judged to be A, a case where color tone change was slightly different was judged to be B, and a case where color tone change was largely different was judged to be C. The direction of absorption axis of the polarizing plate was defined as an azimuth angle of 0°, and the direction vertical to the panel was defined as a polar angle of 0°.

Example 1

(1-1) Production of Substrate Film
(1-1-1) Production of Polymer X

Referring to Production Example described in Japanese Patent Application Laid-Open No. 2002-105151 A, 25 parts of styrene monomer was polymerized at a first stage, 30 parts of styrene monomer and 25 parts of isoprene monomer were polymerized at a second stage, and 20 parts of styrene monomer was polymerized at a third stage to obtain a block copolymer [D1]. The block copolymer was then hydrogenated to synthesize a hydrogenated block copolymer [E1]. The Mw of the hydrogenated block copolymer [E1] was 84,500, the Mw/Mn thereof was 1.20, and the hydrogenation ratio of the main chain and the aromatic ring thereof was almost 100%.

To 100 parts of the hydrogenated block copolymer [E1], 0.1 part of pentaerythrityl tetrakis[3-(3,5-di-t-butyl-4-hydroxyphenyl)propionate] (product name "Songnox1010" manufactured by SONGWON Industrial Co., Ltd.) was mixed by melt-kneading, and made into a form of pellets, to obtain a polymer X for molding.

(1-1-2) Production of Substrate Film A

The polymer X produced in (1-1-1) was supplied to a hot-melt extrusion film molding device equipped with a T-die. The polymer X was extruded from the T-die and wound on a roll at a taking-up speed of 4 m/min. Thus, the polymer X was molded in a form of a film. As a result, a long-length substrate film A (thickness of 25 μm) formed of the polymer X was obtained.

(1-2) Production of Polarizer Material Film

As the primary film, an unstretched polyvinyl alcohol film (average polymerization degree of about 2,400, saponification degree of 99.9% by mole, thickness of 20 μm, hereinafter also referred to as "PVA20") was used.

The primary film was subjected to dry stretching in a lengthwise direction using a longitudinal uniaxial stretching apparatus at a stretching temperature of 130° C. and a stretching ratio of 3.0, to obtain a polarizer material film. The polarizer material film had a thickness of 12 μm, an Re in an in-plane direction of 345 nm, and an Nz factor of 1.0.

(1-3) Production of Layered Body

100 Parts by weight of water, 3 parts by weight of a polyvinyl alcohol-based adhesive ("Z-200" manufactured by The Nippon Synthetic Chemical Industry Co., Ltd.), and 0.3 part by weight of a crosslinking agent ("SPM-01" manufactured by The Nippon Synthetic Chemical Industry Co., Ltd.) were mixed to obtain an adhesive composition. A surface of the substrate film A obtained in (1-1-2) was subjected to a corona treatment, coated with the adhesive composition, and bonded to a surface of the polarizer material film. Keeping this state, the adhesive composition was heated and dried at 70° C. for 5 minutes. As a result, a layered body having a layer structure of "polarizer material film"/"adhesion layer"/"substrate film A (unstretched)" was obtained. The adhesive layer had a thickness of 1 μm.

The bonded surface state of the obtained layered body was evaluated. The results are shown in Table 1.

(1-4) Production of Polarizing Plate (Wet)

While the layered body obtained in (1-3) was continuously conveyed in a lengthwise direction through guiding rollers, the following operation was performed.

The aforementioned layered body was subjected to a dyeing treatment of immersing the layered body in a dyeing solution containing iodine and potassium iodide, and to a first stretching treatment of, after the dyeing treatment, stretching the layered body. Subsequently, the layered body after the first stretching treatment was subjected to a second stretching treatment of stretching the layered body in an acidic bath containing boric acid and potassium iodide at 65° C. The total stretching ratio represented by a product of the stretching ratio in the first stretching treatment and the stretching ratio in the second stretching treatment was set to be 2.0. The stretching directions in both the first stretching treatment and the second stretching treatment were the lengthwise direction.

The layered body after the second stretching treatment was dried at 70° C. for 5 minutes in a drying device. As a result, a polarizing plate having a layer structure of "polarizer"/"adhesion layer"/"substrate film A" was obtained. The thickness and the phase difference Re (substrate Re) in the in-plane direction of the substrate film in the polarizing plate, and the thickness T of the polarizer material film were measured and shown in Table 1 together with results of evaluation of stretching property and black color shift.

Example 2

A polarizing plate was produced by the same manner as that of Example 1 except that the polarizer material film obtained in (2-2) below was used instead of the polarizer material film obtained in (1-2). Evaluation was performed by the same manner as that of Example 1. The results are shown in Table 1.

(2-2) Production of Polarizing Material Film

As the primary film, an unstretched polyvinyl alcohol film (average polymerization degree of about 2,400, saponification degree of 99.9% by mol, thickness of 30 μm, hereinafter also referred to as "PVA30") was used.

The primary film (PVA30) was stretched in the lengthwise direction using a longitudinal uniaxial stretching apparatus at a stretching temperature of 130° C. and a stretching ratio of 3.0, to obtain a polarizer material film.

Example 3

A polarizing plate was produced by the same manner as that of Example 1 except that the substrate film B obtained in (3-1) below was used instead of the substrate film A obtained in (1-1). Evaluation was performed by the same manner as that of Example 1. The results are shown in Table 1.

(3-1) Production of Substrate Film B

A mixture of the polymer X produced in (1-1-1) and polyisobutene ("Nisseki Polybutene HV-300" manufactured by JX Nippon Oil & Energy Corporation, number average molecular weight of 1,400) added at a ratio of 20 parts by weight relative to 100 parts by weight of the polymer X was supplied to a hot-melt extrusion film molding device equipped with a T-die. The mixture of the polymer X and polyisobutene was extruded from the T-die and wound on a roll at a taking-up speed of 4 m/min to obtain a film-shaped long-length substrate film B (thickness of 25 μm).

Example 4

A polarizing plate was produced by the following method, and evaluation thereof was performed by the same manner as that of Example 1. The results are shown in Table 1.

(4-1) Production of Substrate Film C

An acrylic resin (Sumipex HT55X manufactured by Sumitomo Chemical Co., Ltd.) was supplied to a hot-melt extrusion film molding device equipped with a T-die. The acrylic resin was extruded from the T-die and wound on a roll at a taking-up speed of 4 m/min to mold the acrylic resin in a film shape. Thereby a long-length substrate film C (thickness of 25 μm) which was formed of the acrylic resin was obtained.

(4-3) Production of Layered Body

A layered body having a layer structure of "polarizer material film"/"adhesion layer"/"substrate film C (unstretched)" was obtained by the same manner as that of (1-3) of Example 1 except that the substrate film C produced in (4-1) was used instead of the substrate film A in (1-3).

(4-4) Production of Polarizing Plate (Dry)

The layered body obtained in (4-3) was stretched in the lengthwise direction using a longitudinal uniaxial stretching apparatus at a stretching temperature of 110° C. and a stretching ratio of 1.8. The stretched layered body was dyed by immersing it in a dyeing solution containing iodine, potassium iodide, and boric acid, and dried with hot air at 60° C. Subsequently, the dyed layered body was stretched in the lengthwise direction using a longitudinal uniaxial stretching apparatus at a stretching temperature of 90° C. and a stretching ratio of 1.1, to obtain a polarizing plate.

Comparative Example 1

(C1-3) Production of Layered Body

A layered body having a layer structure of "primary film"/"adhesion layer"/"substrate film A (unstretched)" was obtained by the same manner as that of (1-3) of Example 1 except that the primary film (PVA20: unstretched polyvinyl alcohol film) was used instead of the polarizer material film in (1-3).

(C1-4) Production of Polarizing Plate

A polarizing plate was produced by the same manner as that of (1-4) of Example 1 except that the layered body obtained in (C1-3) was used instead of the layered body obtained in (1-3), and that the stretching treatment was performed so that the total stretching ratio was 6.0. Evaluation was performed by the same manner as that of Example 1. The results are shown in Table 1. The substrate film had a poorer stretching ability than that of the polarizer material film, and rupture occurred in the substrate film, and a stable production of the polarizing plate could not be performed.

Comparative Example 2

(C2-3) Production of Layered Body

By the following procedure, a polyvinyl alcohol (PVA) layer was formed on the surface of the substrate film C2 to produce a layered body.

As the substrate film C2, a continuous web substrate film (thickness of 200 μm) of amorphous polyethylene terephthalate (amorphous PET, glass transition temperature of 75° C.) obtained by copolymerization of 6 mol % isophthalic acid was used. As the PVA aqueous solution for forming the PVA layer, an aqueous solution obtained by dissolving PVA powder having a polymerization degree of 1000 or more, a saponification degree of 99% or more, and a glass transition temperature of 80° C. in water to a concentration of 4 to 5% by weight.

The PVA aqueous solution was applied onto a surface of the substrate film C2 and dried at a temperature of 50 to 60° C. to form PVA layer on the surface of the substrate film C2. Thereby a layered body having a layer structure of "PVA layer"/"substrate film C2" was obtained. The thickness of the PVA layer in the layered body is shown in the row of "Thickness before stretching" in Table 1.

(C2-4) Production of Polarizing Plate

The layered body obtained in (C2-3) was subjected to a stretching apparatus installed in an oven set at a stretching temperature environment of 130° C., and free end uniaxial stretching was performed so that the stretching ratio was 1.8 times (first stretching treatment).

A dyeing treatment in which the layered body after the first stretching treatment was immersed in a dyeing solution containing iodine and potassium iodide was performed. Then, the layered body after dyeing treatment was subjected to a stretching apparatus installed in a processing apparatus filled with a boric acid aqueous solution at 65° C. containing boric acid and potassium iodide, and a free end uniaxial stretching treatment was performed so that the stretching ratio was 3.3 times (second stretching treatment). The stretching direction was set in the lengthwise direction for both the first stretching treatment and the second stretching treatment.

The layered body after the second stretching treatment was taken out of the boric acid aqueous solution. Boric acid adhering to the surface of the 3 μm-thick PVA layer formed on the amorphous PET substrate was washed with an aqueous potassium iodide solution, and then the layered body was dried by a drying process using hot air at 60° C. to obtain a polarizing plate. The thickness and phase difference (substrate Re) of the substrate film in the polarizing plate and the thickness (T) of the PVA layer were measured and shown in Table 1 together with the evaluation results of stretching property and black color shift.

The results of Examples and Comparative Examples are shown in Table 1.

In Table 1, "Acryl" means an acrylic resin.

In Table 1, the stretching direction)(° is an angle with respect to the width direction of the film being 0°.

In the table, amorphous PET means amorphous polyethylene terephthalate.

TABLE 1

|  |  |  | Examples |  |  |  | Comp.Ex. |  |
|---|---|---|---|---|---|---|---|---|
|  |  |  | 1 | 2 | 3 | 4 | 1 | 2 |
| Polarizer material film | Before stretching | Primary film | PVA20 | PVA30 | PVA20 | PVA20 | PVA20 | PVA layer |
|  |  | Thickness (μm) | 20 | 30 | 20 | 20 | 20 | 7 |
|  | Stretching conditions | Stretching style | Dry | Dry | Dry | Dry | Not stretched | None |
|  |  |  | Longitudinal uniaxial | Longitudinal uniaxial | Longitudinal uniaxial | Longitudinal uniaxial | — | — |
|  |  | Stretching direction (°) | 90 | 90 | 90 | 90 | — | — |
|  |  | Stretching temperature (° C.) | 130 | 130 | 130 | 130 | — | — |
|  |  | Stretching ratio X | 3.0 | 3.0 | 3.0 | 3.0 | 1.0 | — |
| Substrate film |  | Resin | Polymer X | Polymer X | Polymer X | Acryl | Polymer X | Amorphous PET |
|  |  | Thickness (μm) | 25 | 25 | 25 | 25 | 25 | 200 |
|  |  | Plasticizer, softener | No | No | Yes | No | No | No |
| Layered body |  | Bonded surface state | Good | Good | Good | Good | Good | — |
| Polarizing plate | Stretching conditions | Stretching style | Wet | Wet | Wet | Dry | Wet | Wet |
|  |  |  | Longitudinal uniaxial | Longitudinal uniaxial | Longitudinal uniaxial | Longitudinal uniaxial | Longitudinal uniaxial | Longitudinal uniaxial |
|  |  | Stretching temperature (° C.) | 65 | 65 | 65 | 110 | 65 | 65 |
|  |  | Stretching ratio | 2.0 | 2.0 | 2.0 | 2.0 | 6.0 | 5.9 |
|  | Evaluation | Substrate thickness (μm) | 18 | 18 | 18 | 18 | 10 | 82 |
|  |  | T (μm) | 8 | 12 | 8 | 8 | 8 | 3 |
|  |  | Substrate Re (nm) | 7 | 7 | 3 | 1 | 23 | 8000 |
|  |  | Stretching property | A | A | A | A | C | A |
|  |  | Black color shift | B | B | A | A | C | C |

It is apparent from the results shown in Table 1 that, according to the present invention, the phase difference that is expressed in the substrate film after the step of stretching the layered body can be reduced, whereby the substrate film can be used also as a protective film; and that a thin polarizing plate can be produced efficiently.

REFERENCE SIGN LIST

1 primary film
10 layered body
11 polarizer material film
12 substrate film
13 adhesive layer
100,120,130 polarizing plate
111 polarizer
112 substrate film
113,114 adhesive layer
115 protective film
116 tackiness agent layer
200 production apparatus
201,202 feeding device
203 winding device
204 stretching device
205 bonding device
300 production apparatus
301,307 feeding device
302-305 treatment device
306,309 drying device
308 bonding device
310 winding device
400,450 liquid crystal display device (display device)
410,420 substrate
430 liquid crystal layer
500,550 organic EL display device (display device)
510,520 substrate
530 light-emitting layer

The invention claimed is:

1. A method for producing a polarizing plate including a polarizer and a substrate film, the method comprising:
   stretching a primary film to obtain a polarizer material film,
   providing an unstretched substrate film on the polarizer material film to obtain a layered body, and
   stretching the layered body to obtain the polarizing plate, wherein
   the polarizer includes a dichroic material and has a thickness T of 20 μm or less, and
   a phase difference Re in an in-plane direction of the substrate film in the polarizing plate is 20 nm or less.

2. The method for producing a polarizing plate according to claim 1, wherein the layered body further includes an adhesive layer that is provided between the polarizer material film and the unstretched substrate film.

3. The method for producing a polarizing plate according to claim 1, wherein the substrate film is a film layer formed of at least one type selected from a cycloolefin resin, an amorphous polyester resin, a polyolefin resin, and an acrylic resin.

4. The method for producing a polarizing plate according to claim 1, wherein
   the substrate film is a film formed of a cycloolefin resin,
   the cycloolefin resin contains a cycloolefin-based polymer, and
   the cycloolefin-based polymer is formed of at least one type selected from a hydrogenated product of a ring opening polymer of a norbornene-based monomer, an addition copolymer of a norbornene-based monomer and an α-olefin, and a hydrogenated product thereof.

5. The method for producing a polarizing plate according to claim 1, wherein
the substrate film is a film formed of a cycloolefin resin,
the cycloolefin resin contains a cycloolefin-based polymer, and
the cycloolefin-based polymer is composed of a hydrogenated product of a block copolymer obtained by hydrogenating a block copolymer [D] composed of:
a polymer block [A] containing a repeating unit [I] derived from an aromatic vinyl compound as a main component; and
a polymer block [B] containing the repeating unit [I] derived from an aromatic vinyl compound and a repeating unit [II] derived from a chain conjugated diene compound as a main component or a polymer block [C] containing the repeating unit [II] derived from a chain conjugated diene compound as a main component.

6. The method for producing a polarizing plate according to claim 1, wherein the substrate film contains a plasticizer, a softener or both thereof.

7. The method for producing a polarizing plate according to claim 6, wherein the plasticizer, softener or both thereof is one or more types selected from an ester-based plasticizer and an aliphatic hydrocarbon polymer.

8. The method for producing a polarizing plate according to claim 1, comprising a protective film or a tackiness agent layer on one surface of the polarizer.

9. The method for producing a polarizing plate according to claim 8, wherein the protective film is formed of a cycloolefin resin, an acrylic resin, a polyethylene terephthalate resin, or a triacetyl cellulose resin.

10. The method for producing a polarizing plate according to claim 1, wherein a stretching temperature of the layered body in the stretching step is 65° C. or lower.

* * * * *